United States Patent
Elian et al.

(10) Patent No.: US 12,326,998 B2
(45) Date of Patent: Jun. 10, 2025

(54) ULTRASONIC TRANSDUCER

(71) Applicant: Infineon Technologies AG, Neubiberg (DE)

(72) Inventors: Klaus Elian, Alteglofsheim (DE); Matthias Eberl, Taufkirchen (DE); Horst Theuss, Wenzenbach (DE); Rainer Markus Schaller, Aichen (DE); Fabian Merbeler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 152 days.

(21) Appl. No.: 18/188,611

(22) Filed: Mar. 23, 2023

(65) Prior Publication Data
US 2023/0315235 A1   Oct. 5, 2023

(30) Foreign Application Priority Data
Apr. 4, 2022   (DE) .......................... 102022107944.9

(51) Int. Cl.
*G06F 3/043*   (2006.01)

(52) U.S. Cl.
CPC .... *G06F 3/043* (2013.01); *G06F 2203/04103* (2013.01)

(58) Field of Classification Search
CPC ........... G06F 3/043; G06F 2203/04103; G06F 1/1671; B60K 35/22; B60K 35/60; B60K 35/80; B60K 35/85; B60K 2360/20; B60K 2360/46; B60K 2360/589; B60K 37/20; B60K 2360/1446; B60K 2360/56; B60K 2360/785; B60K 35/10; H03K 2217/96007; H03K 2217/96015; H03K 17/96; B06B 1/02; B06B 1/0688
See application file for complete search history.

(56) References Cited

U.S. PATENT DOCUMENTS

| | | | |
|---|---|---|---|
| 6,825,594 | B1 | 11/2004 | Thurn |
| 2017/0246847 | A1* | 8/2017 | Scurtescu ............... B32B 27/28 |
| 2019/0354210 | A1* | 11/2019 | Akhbari ................ G06F 3/0416 |
| 2021/0239553 | A1 | 8/2021 | Akhbari et al. |

FOREIGN PATENT DOCUMENTS

| | | |
|---|---|---|
| CN | 102873018 A | 1/2013 |
| DE | 19957125 A1 | 6/2001 |
| WO | 2017066612 A1 | 4/2017 |
| WO | 2017/081138 A1 | 5/2017 |
| WO | 2019/226680 A1 | 11/2019 |

\* cited by examiner

*Primary Examiner* — Jonathan A Boyd
(74) *Attorney, Agent, or Firm* — Harrity & Harrity, LLP (57) ABSTRACT

An ultrasonic transducer includes at least one ultrasonic transducer element, a semiconductor chip that includes the ultrasonic transducer element, and a housing. The semiconductor chip is arranged in the housing. The semiconductor chip is embedded in a dimensionally stable encapsulation, wherein a contact surface of the dimensionally stable encapsulation is configured for acoustically coupling the ultrasonic transducer to a casing. Additionally, an ultrasonic transducer system and a method for fitting the ultrasonic transducer or ultrasonic transducer system are provided.

19 Claims, 5 Drawing Sheets

ULTRASONIC TRANSDUCER

CROSS REFERENCE TO RELATED APPLICATION

This application claims priority to German Patent Application No. 102022107944.9 filed on Apr. 4, 2022, the content of which is incorporated by reference herein in its entirety.

BACKGROUND

Interaction of a user with an electronic system is necessary in many fields of application. In a motor vehicle, for example, a switch for actuating the windshield ventilation and a corresponding display are required. Touch sensors are often used as switches. Capacitive touch sensors are subject to restrictions with regard to the material of the surface on which they are intended to detect touches. By way of example, it is not routinely possible to combine a metallic touch surface with a capacitive touch sensor. In the case of ultrasonic touch sensors, based on ultrasonic transducers, the touch surface can consist of different materials. However, a good acoustic coupling to the touch surface is required in order to be able to reliably ascertain a touch.

SUMMARY

An object of the present implementations consists in providing an ultrasonic transducer and an ultrasonic transducer system and also a method which enable a particularly reliable acoustic coupling.

The object has been achieved by the subject matter of the main claim and of the alternative independent claims. Advantageous implementations are specified in the dependent claims.

What is proposed is an ultrasonic transducer, in particular an ultrasonic touch sensor, including at least one ultrasonic transducer element, including at least one semiconductor chip, wherein the semiconductor chip has the ultrasonic transducer element, including at least one housing, wherein the semiconductor chip is arranged in the housing, wherein the semiconductor chip is embedded in a dimensionally stable encapsulation, wherein a contact surface of the encapsulation is configured for acoustically coupling the ultrasonic transducer to a casing.

A description is furthermore given of an ultrasonic transducer system, in particular an ultrasonic touch sensor system, including an ultrasonic transducer described above and a carrier, wherein the carrier is configured for mechanically securing, in particular adhesively bonding and/or screwing and/or clipping, the ultrasonic transducer system on the casing.

Furthermore, a description is given of a method for fitting an ultrasonic transducer or ultrasonic transducer system described above, wherein a coupling intermediate layer is provided between the casing and the ultrasonic transducer.

BRIEF DESCRIPTION OF THE DRAWINGS

Examples of the proposed ultrasonic transducer, ultrasonic transducer system and method will now be explained in greater detail with reference to the drawing. In the drawing.

DETAILED DESCRIPTION

Figure 1:
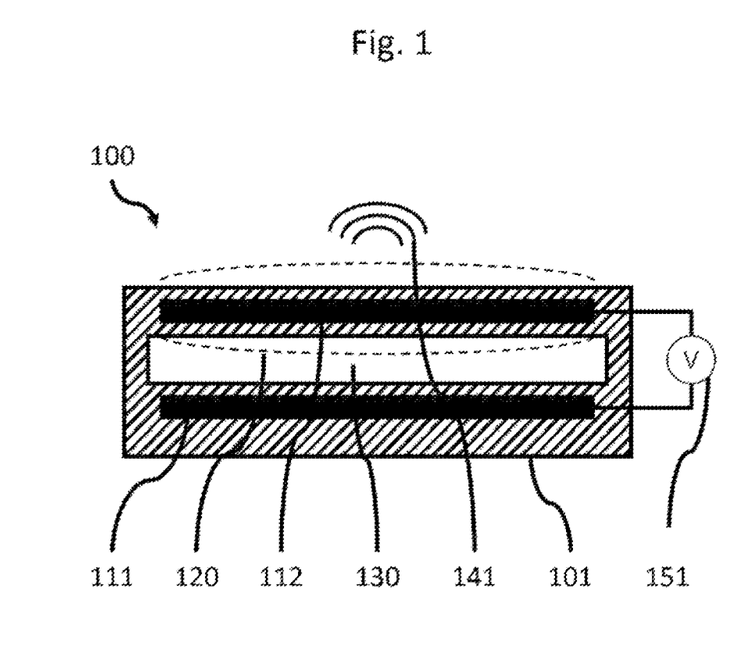
FIG. 1 shows an ultrasonic transducer element.
Figure 2:
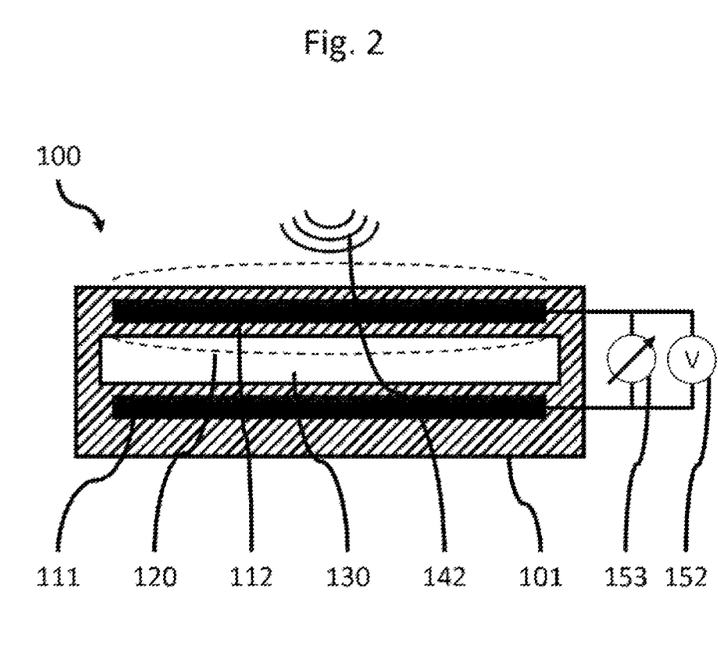
FIG. 2 shows an ultrasonic transducer element.

FIGS. 1 and 2 illustrate an ultrasonic transducer element 100. The ultrasonic transducer element 100 comprises a membrane 120 with an electrode 112 and a substrate 101 with an electrode 111. A cavity 130 is provided between the membrane 120 and the substrate 101, and enables a movement of the membrane 120.

Applying an AC voltage between the electrodes 111 and 112 using a voltage source 151 enables the membrane 120 to be excited to oscillate, such that the ultrasonic transducer element 100 can transmit ultrasonic waves 141.

The ultrasonic transducer element 100 shown in FIGS. 1 and 2 can likewise be used to detect ultrasonic waves 142. For this purpose, a DC voltage can be applied between the electrodes 111 and 112 using the voltage source 152. The ultrasonic waves 142 can excite the membrane 120 to oscillate. An AC voltage is induced owing to the resulting changing distance between the electrodes 111 and 112, and can be measured by a measuring device 153.

FIGS. 3 to 6 schematically illustrate how the ultrasonic transducer element 311 or respectively 411 can be used to detect a touch of a casing 390, 490 on the opposite side of the casing 390, 490 with respect to the ultrasonic transducer. The ultrasonic transducer element 311 or respectively 411 is in each case embedded in an encapsulating layer 320, 420, the encapsulating layer 320, 420 having a contact surface, by which the ultrasonic transducer is attached to the casing 390, 490. The ultrasonic transducer element 311, 411 can in each case be secured on a printed circuit board 370, 470 and can be electrically connected thereto.

Figure 3:
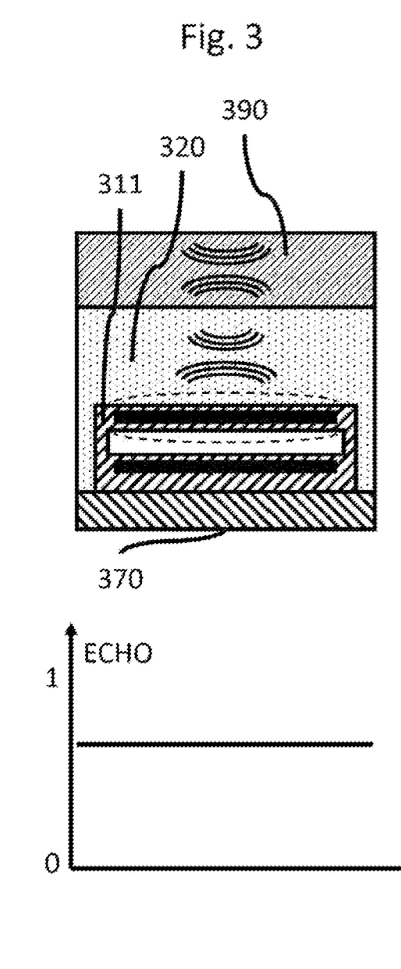
FIG. 3 shows an ultrasonic transducer element in a first situation.

As shown in FIG. 3, ultrasonic waves can be generated using the ultrasonic transducer element 311, which are transmitted substantially completely through the interface between the encapsulating layer 320 and the casing 390 and are subsequently reflected at the free surface of the casing 390 on the opposite side with respect to the encapsulating layer 320. After repeated transmission through the interface between the casing 390 and the encapsulating layer 320, the ultrasonic waves can be detected by the sensor element 311 again, such that an echo signal, as is shown under FIG. 3, is obtained.

Figure 4:
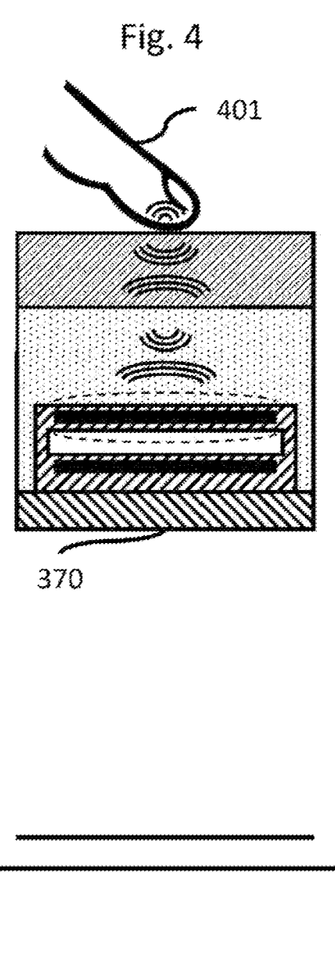
FIG. 4 shows the ultrasonic transducer element shown in FIG. 3 in a second situation.

In the case where the free surface of the casing 390 on the opposite side with respect to the encapsulating layer 320 is touched, for example by a finger 401, only a smaller proportion of the ultrasonic waves is reflected at the free surface and the echo signal decreases, as is illustrated under FIG. 4.

Figure 5:
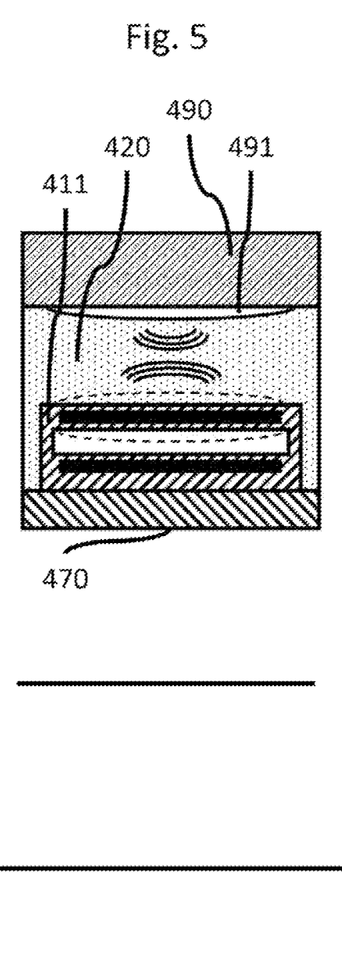
FIG. 5 shows an ultrasonic transducer element in a third situation.

FIG. 5 illustrates that a hollow space 491 remained when the ultrasonic touch sensor was attached to the casing 490. The hollow space 491 has the consequence that the ultrasonic waves transmitted by the sensor element 411 do not pass through the interface between the encapsulating layer 420 and the casing 490, but rather are reflected at this interface, such that an echo signal, as is illustrated underneath, is obtained.

Figure 6:
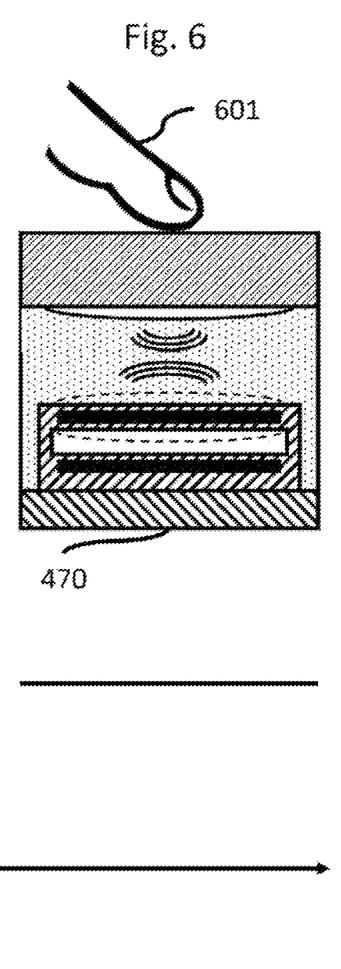
FIG. 6 shows the ultrasonic transducer element shown in FIG. 6 in a fourth situation.

Since the ultrasonic waves are not (or hardly) transmitted into the casing, the echo signal is not changed as a result of the casing 490 being touched by the finger 601.

Even though a capacitive ultrasonic transducer element 311, 411 has been described above, corresponding configurations are also applicable to a piezoelectric ultrasonic transducer element, in particular to ultrasonic transceivers which operate according to a piezoelectric measurement principle.

Figure 7:
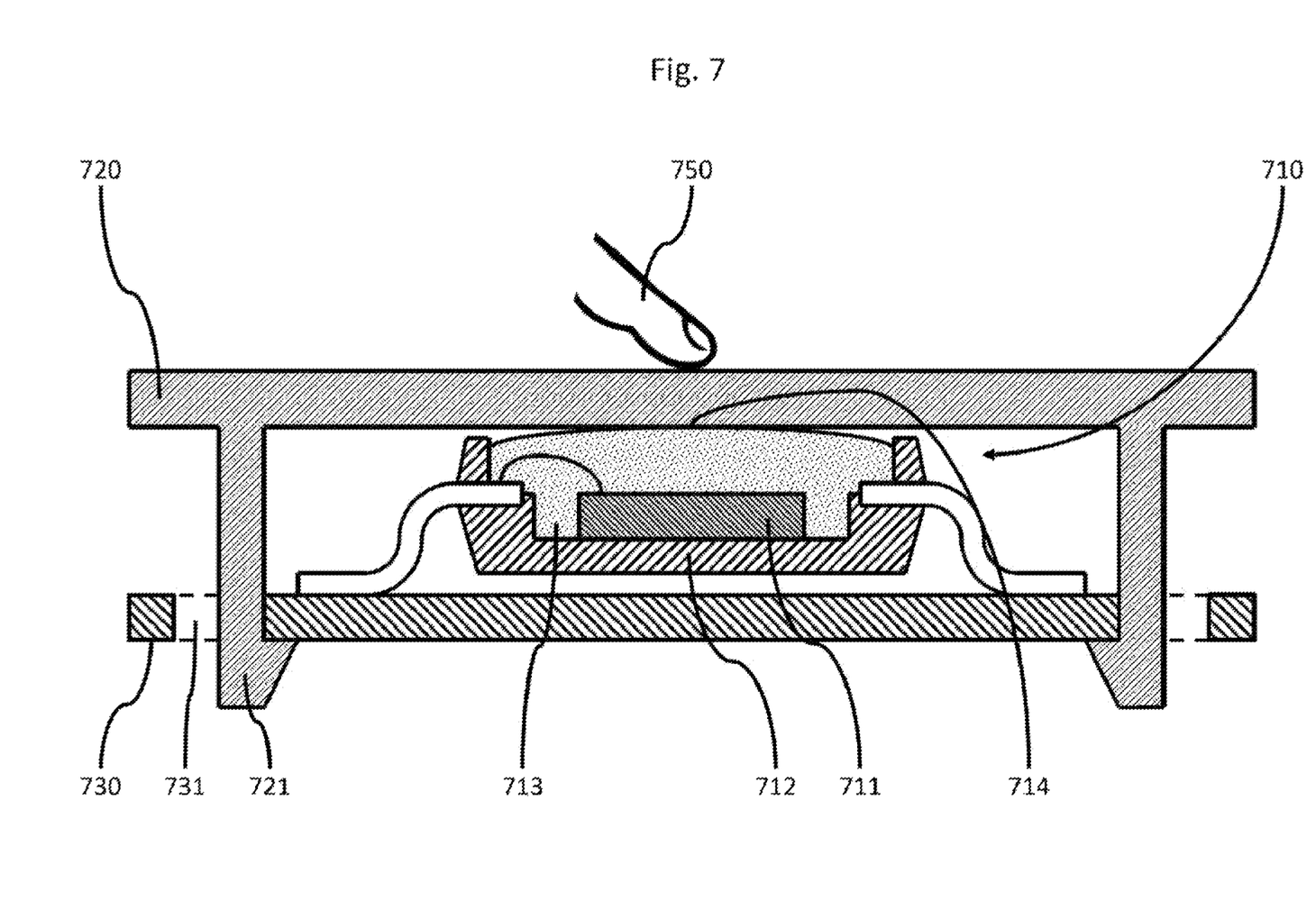
FIG. 7 shows a first ultrasonic transducer system.

FIG. 7 illustrates an ultrasonic transducer 710 having at least one semiconductor chip 711. The semiconductor chip 711 has an ultrasonic transducer element, by which ultrasonic waves can be transmitted and/or received. The semiconductor chip 711 is arranged in a housing 712. As indicated in FIG. 7, the semiconductor chip 711 can be connected to contacts of the housing by wires in a customary manner in order to be able to electrically connect the ultrasonic transducer 710 to further circuits.

The semiconductor chip 711 is embedded in a dimensionally stable encapsulation 713 in the housing 712. A contact surface 714 of the encapsulation 713 serves for acoustically coupling the ultrasonic transducer 710 to a casing 720. As has been explained in greater detail and illustrated in FIGS. 3 to 6, this can make it possible to detect when a finger 750, for example, touches the casing 720.

The encapsulation 713 is distinguished by the fact that it is substantially dimensionally stable. In particular, the encapsulation 713 can be configured such that it substantially maintains its shape in the case of typical press-on pressures.

The encapsulation 713 can be elastic. When the ultrasonic transducer 710 is pressed onto the casing 720, the elasticity of the encapsulation 713 can ensure that a permanent, optimum mechanical contact between the contact surface 714 and the surface of the casing 720 is attained. In particular, such a contact can be ensured even in the case of irregularly shaped casings 720 and/or in the case of vibrations.

The encapsulation 713 can be produced from a material comprising silicone and/or polybutadiene and/or acrylate and/or a filler. The filler can serve in particular for setting a density of the encapsulation.

In the example implementation illustrated in FIG. 7, the contact surface 714 of the encapsulation 713 is embodied in convex fashion. A different design of the contact surface 714 is also conceivable depending on the casing 720 on which the ultrasonic transducer 710 is intended to be fitted.

The ultrasonic transducer 710 can be fitted on a carrier 730 and can form an ultrasonic transducer system in this way. The carrier 730 can be configured in particular for mechanically securing, in particular for adhesively bonding and/or for screwing and/or for clipping, the ultrasonic transducer system on the casing 720. In particular, the ultrasonic transducer system can be fitted on the casing 720 without contact being produced between the housing 712 of the ultrasonic transducer 710 and the casing 720. The carrier 730 can be a printed circuit board, in particular, which establishes a connection from the ultrasonic transducer 710 to an evaluation circuit. The carrier 730 can thus serve both mechanical and electrical purposes.

In FIG. 7, the carrier is clipped onto the casing 720 using a hook 721 of the casing 720 and a cutout 731.

The cutout 731 can be regarded as a casing positioning aid 731 serving for accurately positioning the carrier 730 on the casing 720.

Figure 8:
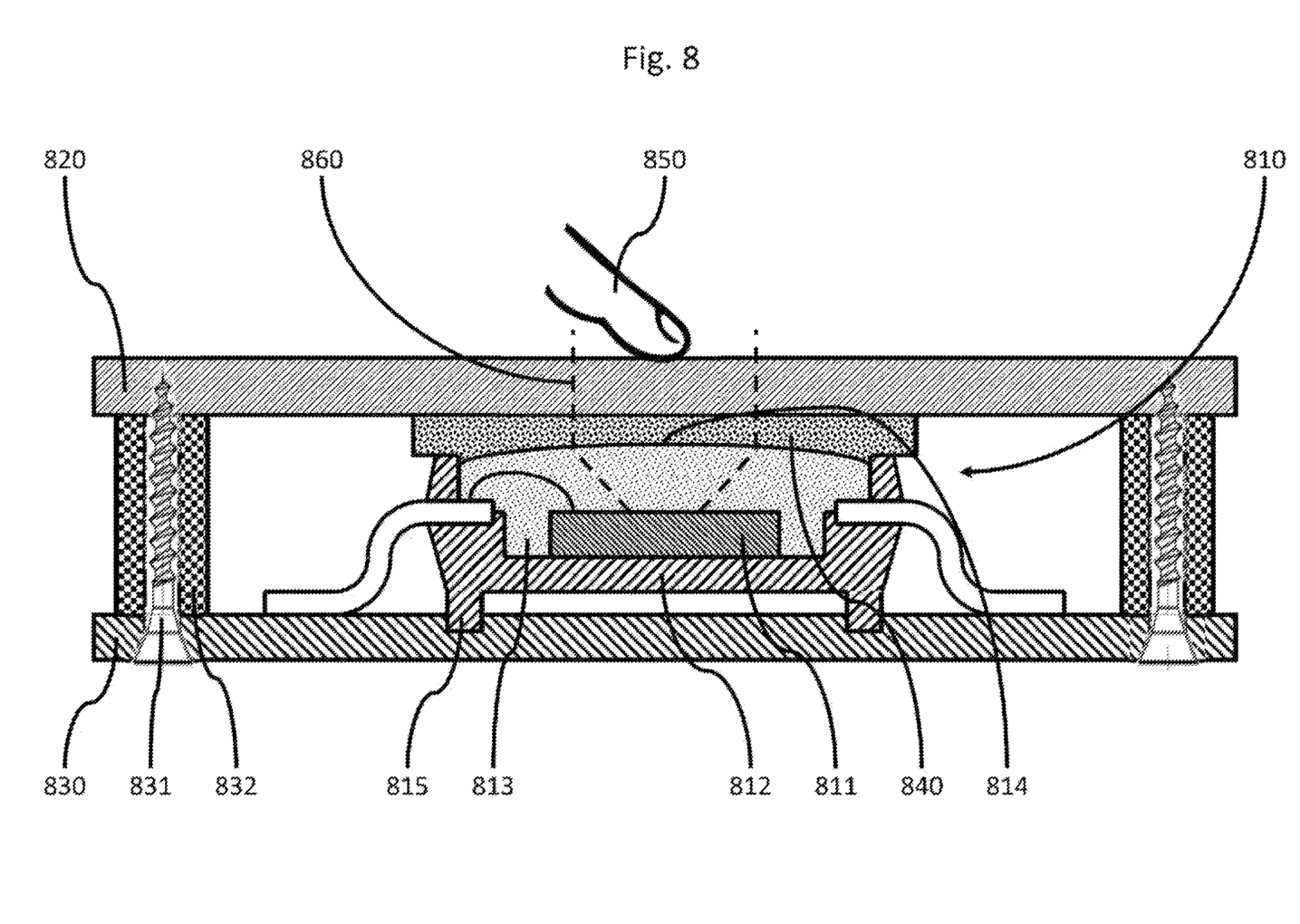
FIG. 8 shows a second ultrasonic transducer system.
Figure 9:
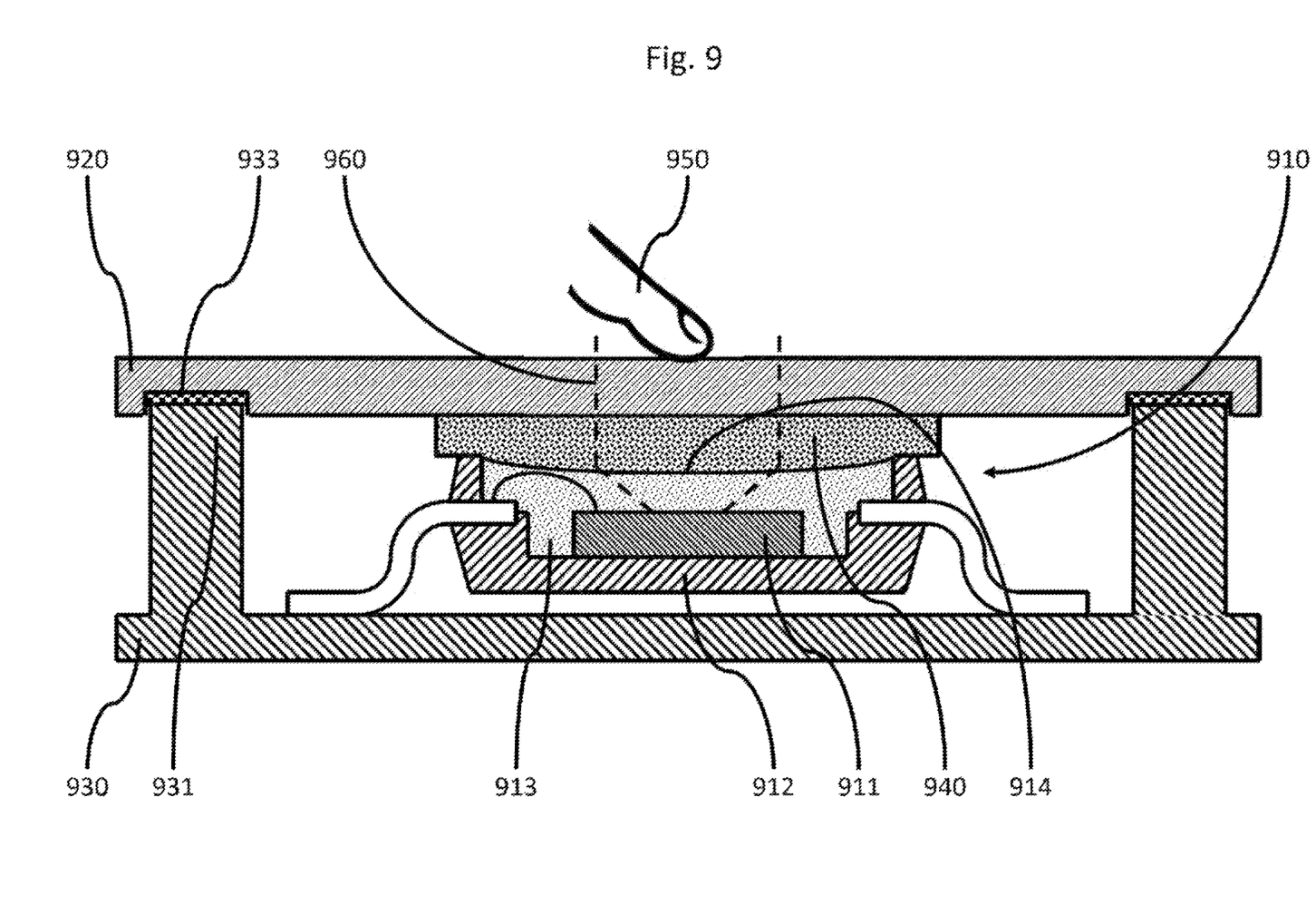
FIG. 9 shows a third ultrasonic transducer system.

In principle, the variants illustrated in FIGS. 8 and 9 can also be used for securing the ultrasonic sensor system. In particular, the type of securing can be chosen independently of the type of ultrasonic transducer.

FIG. 8 illustrates a further ultrasonic transducer 810. The ultrasonic transducer 810 once again has a semiconductor chip 811 having an ultrasonic transducer element (not illustrated in FIG. 8). The semiconductor chip 811 is arranged in a housing 812 and is embedded in a dimensionally stable encapsulation 813. The encapsulation 813 is once again embodied in dimensionally stable fashion. A contact surface 814 serves for acoustically coupling the ultrasonic transducer 810 to the casing 820.

The housing 812 of the ultrasonic transducer 810 has a housing positioning aid 815 for positioning the housing 812 on the carrier 830.

The carrier 830 is configured for screwing the ultrasonic transducer system to the casing 820. For this purpose, the carrier 830 has a screw 831 and spacers 832. The spacers 832 can be fixedly connected to the casing 820, such that a secure positioning of the carrier 830 in relation to the casing 820 is possible when the carrier 830 is screwed to the casing 820.

It is likewise conceivable to provide the spacers 832 fixedly on the carrier 830 and to provide corresponding mechanical features on the casing 820 which make it possible to ensure an accurate positioning of the carrier 830 in relation to the casing 820.

A coupling intermediate layer 840 is provided between the ultrasonic transducer 810, in particular the contact surface 814 thereof, and the casing 820. The coupling intermediate layer can comprise an adhesive layer and/or a foam layer.

Together with the convex design of the contact surface 814 of the encapsulation 813, the coupling intermediate layer 840 can act as an acoustic lens.

The coupling intermediate layer 840 can be applied to the ultrasonic transducer 810 before the ultrasonic transducer 810 is fitted on the casing 820. However, it is also conceivable for the coupling intermediate layer 840 to be fitted first on the casing 820 before the ultrasonic transducer 810 is fitted.

In FIG. 8, the lens effect is represented by the ultrasonic waves 860 refracted at the interface.

A speed of sound $c_2$ of the coupling intermediate layer 840 can be higher than a speed of sound $c_1$ of the encapsulation 813.

If alpha one describes the angle with respect to the normal to the contact surface 814 at which the ultrasonic waves 860 from the ultrasonic transducer element are incident on the contact surface 814 and alpha two describes the corresponding angle of emergence, it holds true that:

$$\frac{\sin\alpha_1}{c_1} = \frac{\sin\alpha_2}{c_2}$$

Preferably, the speeds of sound $c_1$ and $c_2$ of the encapsulation 813 and of the coupling intermediate layer 840 and the density $\rho_1$ of the encapsulation 813 and $\rho_2$ of the coupling intermediate layer 840 are chosen such that the encapsulation 813 and the coupling intermediate layer 840 have the same acoustic impedance Z:

$$Z = \rho_1 \cdot c_1 = \rho_2 \cdot c_2$$

FIG. 9 illustrates a further ultrasonic transducer 910. The semiconductor chip 911 of the ultrasonic transducer 910 is arranged in a housing 912 and is embedded in the dimensionally stable encapsulation 913. The contact surface 914 of the encapsulation 913, serving for acoustically coupling the ultrasonic transducer 910 to the casing 920, is shaped concavely.

A casing positioning aid 931 of the carrier 930 serves for positioning the carrier 930 on the casing 920, on which the carrier 930 is secured using an adhesive layer 933.

Even though some examples of the ultrasonic transducer and/or of the ultrasonic transducer system have been explained in association with touch sensors and/or touch sensor systems, diverse further applications of the ultrasonic transducers and ultrasonic transducer systems described are possible.

In contrast to the example illustrated in FIG. 8, the contact surface 914 of the encapsulation 913 is embodied in concave fashion.

In order to attain the beam path of the ultrasonic waves 960, a lower value is chosen for the speed of sound of the coupling intermediate layer 940 than for the speed of sound of the encapsulation 913.

With the ultrasonic transducer system in accordance with FIG. 9, too, the touch of the casing 920 by a finger 950 can thus be reliably detected.

ASPECTS

Some example implementations are defined by the following aspects:

Aspect 1. An ultrasonic transducer (710, 810, 910) comprising at least one ultrasonic transducer element, comprising at least one semiconductor chip (711, 811, 911), wherein the semiconductor chip (711, 811, 911) has the ultrasonic transducer element, comprising at least one housing (712, 812, 912), wherein the semiconductor chip (711, 811, 911) is arranged in the housing (712, 812, 912), wherein the semiconductor chip (711, 811, 911) is embedded in a dimensionally stable encapsulation (713, 813, 913), wherein a contact surface (714, 814, 914) of the encapsulation (713, 813, 913) is configured for acoustically coupling the ultrasonic transducer (710, 810, 910) to a casing (720, 820, 920).

Aspect 2. An ultrasonic transducer (710, 810, 910) according to Aspect 1,
wherein the encapsulation (713, 813, 913) is elastic.

Aspect 3. An ultrasonic transducer (710, 810, 910) according to Aspect 1 or 2,
wherein the encapsulation (713, 813, 913) is produced from a material comprising silicone and/or polybutadiene and/or acrylate and/or a filler.

Aspect 4. The ultrasonic transducer (710, 810) according to any of Aspects 1 to 3, wherein the contact surface (714, 814) of the encapsulation (713, 813) is convex.

Aspect 5. The ultrasonic transducer (910) according to any of Aspects 1 to 3,
wherein the contact surface (914) of the encapsulation (913) is concave.

Aspect 6. An ultrasonic transducer system
comprising an ultrasonic transducer (710, 810, 910) according to any of the preceding Aspects 1 to 5, and a carrier (730, 830, 930),
wherein the carrier (730, 830, 930) is configured for mechanically securing, in particular adhesively bonding and/or screwing and/or clipping, the ultrasonic transducer system on the casing (720, 820, 920).

Aspect 7. The ultrasonic transducer system according to Aspect 6,
wherein the carrier (730, 930) has at least one casing positioning aid (731, 931) for positioning the carrier (730, 930) on the casing (720, 920).

Aspect 8. The ultrasonic transducer system according to either of Aspects 6 and 7,
wherein the housing (812) of the ultrasonic transducer (810) has a housing positioning aid (815) for positioning the housing (812) on the carrier (830).

Aspect 9. A method for fitting an ultrasonic transducer (810, 910) according to any of Aspects 1 to 5 or an ultrasonic transducer system according to any of Aspects 6 to 8,
wherein a coupling intermediate layer (840, 940) is provided between the casing (820, 920) and the ultrasonic transducer (810, 910).

Aspect 10. The method according to Aspect 9,
wherein the coupling intermediate layer (840, 940) comprises an adhesive layer and/or a foam layer.

Aspect 11. The method according to either of Aspects 9 and 10,
wherein a speed of sound of the coupling intermediate layer (840) is higher than a speed of sound of the encapsulation (813).

Aspect 12. The method according to either of Aspects 9 and 10,
wherein a speed of sound of the coupling intermediate layer (940) is lower than a speed of sound of the encapsulation (913).

Aspect 13. The method according to any of Aspects 9 to 12,
wherein the coupling intermediate layer (840, 940) is applied to the ultrasonic transducer (810, 910) before the ultrasonic transducer (810, 910) or the ultrasonic transducer system is fitted on the casing (820, 920).

Aspect 14. The method according to any of Aspects 9 to 12,
wherein the coupling intermediate layer (840, 940) is applied to the casing (820, 920) before the ultrasonic transducer (810, 910) or the ultrasonic transducer system is fitted on the casing (820, 920).

Although specific example implementations have been illustrated and described in this description, persons having customary knowledge in the art will recognize that a large number of alternative and/or equivalent implementations can be chosen as substitution for the specific example implementations shown and described in this description, without departing from the scope of the implementations disclosed. The intention is for this application to cover all adaptations or variations of the specific example implementations discussed here. Therefore, the intention is for this implementations to be restricted only by the claims and the equivalents of the claims.

The invention claimed is:
1. An ultrasonic transducer, comprising:
at least one ultrasonic transducer element;
a semiconductor chip comprising the at least one ultrasonic transducer element; and
a housing,
wherein the semiconductor chip is arranged in the housing,
wherein the semiconductor chip is embedded in a dimensionally stable encapsulation, wherein a contact surface of the dimensionally stable encapsulation is configured for acoustically coupling the at least one ultrasonic transducer element to a casing, wherein the housing comprises a base to which the semiconductor chip is coupled and sidewalls that define an opening, wherein the base and the sidewalls form a one-piece construction, wherein the semiconductor chip is arranged within the opening, wherein the dimensionally stable encapsulation fills at least a portion of the opening in order to encapsulate the semiconductor chip within the opening, and wherein the contact surface of the dimensionally stable encapsulation is arranged in the opening or protrudes from the opening.

2. An ultrasonic transducer as claimed in claim 1, wherein the dimensionally stable encapsulation is elastic.

3. An ultrasonic transducer as claimed in claim 1, wherein the dimensionally stable encapsulation is produced from a material comprising at least one of silicone, polybutadiene, acrylate, or a filler.

4. The ultrasonic transducer as claimed in claim 1, wherein the contact surface of the dimensionally stable encapsulation is convex or concave.

5. The ultrasonic transducer as claimed in claim 1, further comprising:

one or more electrically conductive contacts that laterally extend from within the opening of the housing to an exterior of the housing, wherein the one or more electrically conductive contacts are electrically connected to the semiconductor chip.

6. The ultrasonic transducer as claimed in claim 5, further comprising:

a carrier to which the one or more electrically conductive contacts is coupled, wherein the one or more electrically conductive contacts are electrically connected to the carrier, and wherein the casing and the carrier define a cavity in which the housing is arranged.

7. The ultrasonic transducer as claimed in claim 6, wherein the one or more electrically conductive contacts mechanically couple the housing to the carrier.

8. The ultrasonic transducer as claimed in claim 6, wherein the one or more electrically conductive contacts mechanically couple the housing to the carrier such that the housing and the carrier are separated by a gap.

9. The ultrasonic transducer as claimed in claim 6, wherein the one or more electrically conductive contacts mechanically couple the housing to the carrier such that the housing is not in direct contact with the carrier.

10. The ultrasonic transducer as claimed in claim 1, wherein the dimensionally stable encapsulation is configured to substantially maintain a shape in response to press-on pressures applied to the contact surface, and wherein an elasticity of the dimensionally stable encapsulation is configured to ensure that a permanent mechanical contact between the contact surface and the casing is maintained, the permanent mechanical contact being direct contact or indirect contact.

11. The ultrasonic transducer as claimed in claim 1, further comprising:

a carrier to which the housing is coupled, wherein the casing and the carrier define a cavity in which the housing is arranged, and wherein the housing is arranged between the casing and the carrier.

12. An ultrasonic transducer system, comprising:

an ultrasonic transducer comprising:

at least one ultrasonic transducer element;

a semiconductor chip comprising the at least one ultrasonic transducer element;

and a housing, wherein the semiconductor chip is arranged in the housing, wherein the semiconductor chip is embedded in a dimensionally stable encapsulation, wherein a contact surface of the dimensionally stable encapsulation is configured for acoustically coupling the at least one ultrasonic transducer element to a casing, wherein the housing comprises a base to which the semiconductor chip is coupled and sidewalls that define an opening, wherein the base and the sidewalls form a one-piece construction, wherein the semiconductor chip is arranged within the opening, wherein the dimensionally stable encapsulation fills at least a portion of the opening in order to encapsulate the semiconductor chip within the opening, and wherein the contact surface of the dimensionally stable encapsulation is arranged in the opening or protrudes from the opening; and a carrier to which the housing is mechanically coupled, wherein the carrier is configured for mechanical coupling to the casing by adhesively bonding, screwing, or clipping, and wherein the carrier is configured to define, together with the casing, a cavity in which the housing is arranged.

13. The ultrasonic transducer system as claimed in claim 12, wherein the carrier has at least one casing positioning aid for positioning the carrier on the casing.

14. The ultrasonic transducer system as claimed in claim 12, wherein the housing of the ultrasonic transducer has a housing positioning aid for positioning the housing on the carrier.

15. The ultrasonic transducer system as claimed in claim 12, further comprising:

the casing, wherein the casing is coupled to the carrier to define the cavity, and wherein the dimensionally stable encapsulation is mechanically coupled to the casing; and a coupling intermediate layer arranged between the casing and the ultrasonic transducer, wherein the coupling intermediate layer provides a mechanical coupling between the casing and the contact surface of the dimensionally stable encapsulation, and wherein the contact surface of the dimensionally stable encapsulation is arranged in indirect contact with the casing via the coupling intermediate layer.

16. The ultrasonic transducer system as claimed in claim 12, further comprising:

the casing, wherein the casing is coupled to the carrier to define the cavity, and wherein the dimensionally stable encapsulation is mechanically coupled to the casing.

17. A method for fitting an ultrasonic transducer, the method comprising:
    providing a semiconductor chip of the ultrasonic transducer, wherein the semiconductor chip comprises at least one ultrasonic transducer element of the ultrasonic transducer;
    providing a housing of the ultrasonic transducer,
        wherein the housing comprises a base to which the semiconductor chip is coupled and sidewalls that define an opening,
        wherein the base and the sidewalls form a one-piece construction, and
        wherein the semiconductor chip is arranged within the opening
    providing a dimensionally stable encapsulation within the opening of the housing, wherein the semiconductor chip is embedded in the dimensionally stable encapsulation, wherein the dimensionally stable encapsulation fills at least a portion of the opening in order to encapsulate the semiconductor chip within the opening, and wherein a contact surface of the dimensionally stable encapsulation is arranged in the opening or protrudes through the opening; and
    arranging the ultrasonic transducer, including the semiconductor chip, the housing, and the dimensionally stable encapsulation, within a cavity defined by a casing, wherein the contact surface of the dimensionally stable encapsulation is arranged in direct or indirect contact with the casing and is configured for acoustically coupling the at least one ultrasonic transducer element to the casing.

18. The method as claimed in claim 17, further comprising:
    providing a coupling intermediate layer between the casing and the ultrasonic transducer,
    wherein the coupling intermediate layer provides a mechanical coupling between the casing and the contact surface of the dimensionally stable encapsulation.

19. An ultrasonic transducer system, comprising:
    at least one ultrasonic transducer element;
    a semiconductor chip comprising the at least one ultrasonic transducer element;
    a casing configured to receive press-on pressures;
    a carrier, wherein the casing and the carrier define a cavity;
    a housing coupled to the carrier and arranged, within the cavity, between the casing and the carrier; and
    a dimensionally stable encapsulation in which the semiconductor chip is embedded,
        wherein the housing comprises a base to which the semiconductor chip is coupled and sidewalls that define an opening,
        wherein the semiconductor chip is arranged within the opening of the housing,
        wherein the dimensionally stable encapsulation fills at least a portion of the opening in order to encapsulate the semiconductor chip within the opening,
        wherein a contact surface of the dimensionally stable encapsulation is configured for acoustically coupling the at least one ultrasonic transducer element to the casing, and
        wherein the contact surface of the dimensionally stable encapsulation is arranged in the opening or protrudes from the opening.

* * * * *